US012640692B2

(12) United States Patent     (10) Patent No.:   US 12,640,692 B2

Ayranci et al.     (45) Date of Patent:    May 26, 2026

(54) WIDEBAND NOISE SHAPING SPLIT LNA ARCHITECTURE

(71) Applicant: Murata Manufacturing Co., Ltd., Nagaokakyo (JP)

(72) Inventors: Emre Ayranci, Costa Mesa, CA (US); Miles Sanner, San Diego, CA (US); Anoop Sheokand, Lake Forest, CA (US); Mengsheng Rui, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 383 days.

(21) Appl. No.: 18/449,221

(22) Filed: Aug. 14, 2023

(65) Prior Publication Data

US 2024/0388260 A1    Nov. 21, 2024

Related U.S. Application Data

(60) Provisional application No. 63/502,202, filed on May 15, 2023.

(51) Int. Cl.
*H03F 3/16*     (2006.01)
*H03F 1/56*     (2006.01)

(52) U.S. Cl.
CPC .............. *H03F 3/16* (2013.01); *H03F 1/565* (2013.01); *H03F 2200/294* (2013.01); *H03F 2200/372* (2013.01); *H03F 2200/387* (2013.01)

(58) Field of Classification Search
CPC ...... H03F 3/16; H03F 1/565; H03F 2200/294; H03F 2200/372; H03F 2200/387; H03F 2200/492; H03F 3/195; H03F 2200/451; H03F 2200/541; H03F 1/223
USPC .......................................... 330/301, 291, 311
See application file for complete search history.

(56) References Cited

U.S. PATENT DOCUMENTS

| | | | |
|---|---|---|---|
| 10,700,650 B1 | 6/2020 | Ayranci et al. | |
| 12,119,797 B2 * | 10/2024 | Cui ...................... | H03F 3/45188 |
| 2017/0187338 A1 | 6/2017 | Wang et al. | |
| 2018/0167040 A1 | 6/2018 | Sayilir et al. | |
| 2024/0056033 A1 * | 2/2024 | Pehlke ................... | H03F 3/195 |

OTHER PUBLICATIONS

International Search Report and Written Opinion issued for International PCT Application No. PCT/JP2024/016857 filed on May 2, 2024 on behalf of Murata Manufacturing Co., Ltd. Mail Date: Sep. 4, 2024. 19 pages.
Wang, K. et al., "A 22-to-47 Ghz 2-Stage LNA With 22.2 dB Peak Gain by Using Coupled L-Type Interstage Matching Inductors" IEEE Transactions on Circuits and Systems I: Regular Papers, vol. 67, No. 12, Dec. 2020. pp. 4607-4617. 11 pages.

* cited by examiner

*Primary Examiner* — Hieu P Nguyen
(74) *Attorney, Agent, or Firm* — Steinfl + Bruno LLP

(57) ABSTRACT

Split low noise amplifier (LNA) architectures providing an improved tradeoff between the noise figure (NF) and the output-to-output isolation are disclosed. The described LNAs include cascode transistors in two amplification paths and an inductive element including a pair of inductors and a common inductor. The inductance values of the inductors and the common inductor can be selected to obtain an improved tradeoff between the NF and isolation while meeting the output matching conditions.

20 Claims, 6 Drawing Sheets

100

200A

WIDEBAND NOISE SHAPING SPLIT LNA ARCHITECTURE

CROSS REFERENCE TO RELATED APPLICATIONS

The present application is a U.S. Non-Provisional Patent Application that claims priority to U.S. Provisional Application No. 63/502,202 filed on May 15, 2023, the contents which are being incorporated herein by reference in its entirety.

FIELD

The present disclosure is related to low noise amplifiers (LNAs), in particular a wideband noise shaping split LNA architecture. More in particular, the disclosed methods and devices address the problem of optimizing the tradeoff between the noise figure (NF) and output-to-output isolation in split LNA architectures.

BACKGROUND

Split LNAs are generally used in a wide range of radio frequency (RF) applications, including wireless communication systems, radar systems, and satellite communication systems. Such LNAs are designed to provide high gain, low noise figure (NF), and excellent output-to-output isolation to reduce interference between different parts of the system. However, achieving high output-to-output isolation and low NF simultaneously is a challenging task that demands careful design and optimization of the LNA circuitry.

When designing for application with more stringent requirements, LNA architectures providing an improved tradeoff between the NF and output-to-output isolation is highly desired.

SUMMARY

The described methods and devices address the above-mentioned design challenge.

According to a first aspect of the present disclosure, a low noise amplifier (LNA) is provided, comprising: an input transistor, a first transistor, and a second transistor; an inductive element comprising a pair of mutually coupled inductors; a first end of the inductive element and drain-terminals of the first and the second transistors being tied together, and a second end of the inductive element being coupled to a bias voltage; wherein: the LNA is configured to receive an input signal from an input terminal, and to generate a first output signal at a first output terminal, and a second amplified signal at a second output terminal, the input terminal being coupled to the input transistor; and inductance values of each inductor of the pair of mutually coupled inductors and a degree of mutual coupling of the pair of mutually coupled inductors are selectable to control noise figure and output-to-output isolation values while maintaining a set output matching condition.

According to a second aspect of the present disclosure, a low noise amplifier (LNA) is provided, comprising: an input transistor, a first transistor, and a second transistor; an inductive element comprising: a first inductor coupled to a drain terminal of the second transistor; a second inductor coupled to a drain terminal of the third transistor, and a common inductor tied at a common node together with the first and second inductor, wherein: the LNA is configured to receive an input signal from an input terminal, and to generate a first output signal at a first output terminal, and a second amplified signal at a second output terminal, the input terminal being coupled to the input transistor; and inductance values of the first and the second inductor and the choke inductor are selected to meet desired noise figure and output-to-output isolation values while maintaining a set matching condition.

According to a third aspect of the present disclosure, a method of adjusting a noise figure and output-to-output isolation in a low noise split amplifier (LNA) is disclosed, the split LNA comprising: an input transistor, a first transistor, and a second transistor, wherein the input transistor and the first transistor form a first amplification path, and the input transistor and the second transistor form a second amplification path distinct from the first amplification path; and an inductive element comprising a pair of mutually coupled inductors; a first end of the inductive element and drain-terminals of the first and the second transistors being tied together, the method comprising controlling a coupling factor of the pair of mutually coupled inductors; and adjusting the noise figure and the output-to-output isolation of the LNA while maintaining a set output matching.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Throughout this document, the term "mutually coupled inductors" refers to a configuration where two or more inductors are physically disposed in a circuit to allow magnetic coupling between them. This magnetic coupling occurs when the magnetic field generated by one inductor induces a voltage or current in the other inductor. The degree of coupling between the inductors is often quantified using a parameter called mutual coupling coefficient. A transformer is an example where a pair of mutually coupled inductors are implemented.

Figure 1:
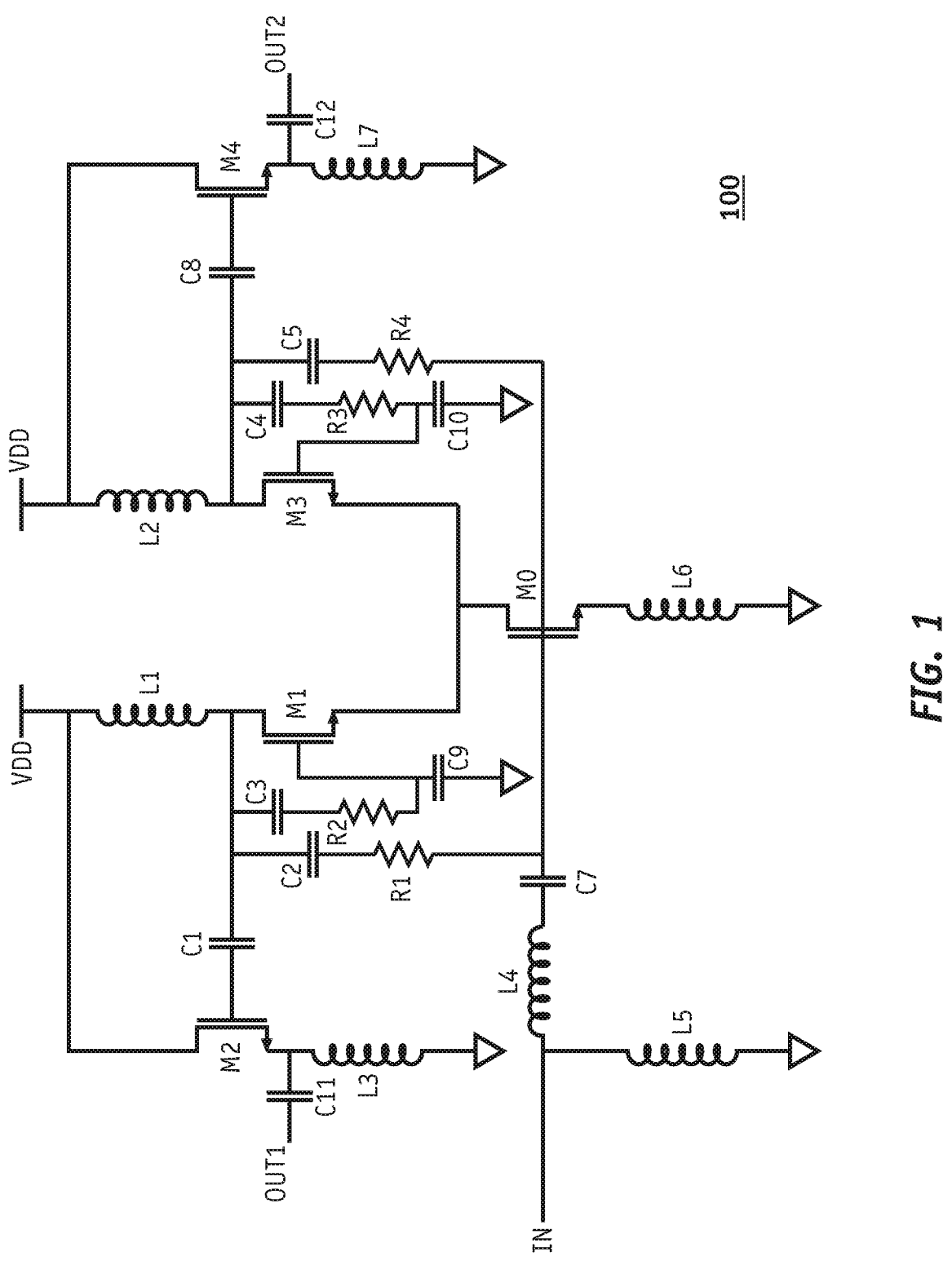
FIG. 1 shows a split LNA.

Throughout the rest of this document, an exemplary LNA architecture such as the one shown in FIG. 1 will be used to describe more in detail the problem addressed and the corresponding disclosed solutions. As it will become apparent later in the document, the described solutions can also be applied to LNA architectures other than the one shown in FIG. 1.

FIG. 1 shows a split LNA (100) configured to receive an input signal at input terminal (IN) and to generate output signals at output terminals (OUT1, OUT2). A first amplification path includes transistors (M0, M1, M2) and inductor (L1), while a second amplification path includes transistors (M0, M3, M4) together with inductor (L2), thus forming a split amplification path configuration. The degree of amplification the input signal will experience through the first and the second amplification path may be the same or different. In the representation of FIG. 1, each pair of transistors (M0, M1) or transistors (M0, M3) is essentially arranged in a cascode configuration associated with their respective amplification path. Throughout the rest of the document, transistors (M1, M3) will be referred to as the "cascode transistors". Transistors (M2, M4) are arranged in a source-follower configuration in the representation of FIG. 1, although other configurations may be envisaged.

Continuing with the description of split LNA (100) of FIG. 1, the combination of inductors (L4, L5, L6) with capacitor (C7) is designed for input matching. Inductors (L3, L7) are load inductances and inductor (L6) is a degenerative inductance. Cascode transistors (M1, M3) are connected to a biasing voltage (Vdd) through respective inductors (L1, L2). Capacitors (C3, C4, C7) are direct current (DC) blocking capacitors, capacitors (C2, C5) are feedback capacitors, and capacitors (C9, C10) are cascode bypass capacitors. The combination of capacitor (C1) and inductor (L1) functions as an output matching network for the first stage, while the combination (L3, C11) does the same for output terminal (OUT1). Similarly, the combination of (L2, C8) makes the first stage outputmatch while the combination of capacitor (C12) and inductor (L7) serves as an output matching network for the output terminal (OUT2).

The topology shown in FIG. 1 provides a reasonable isolation, but worse NF when compared with a single-mode cascode LNA (e.g. either of the pairs (M0, M1) or (M0, M3) used alone) due to extra NF contribution from the cascode transistors (M1, M3).

By shorting the drains of M1 and M3, the NF contribution from the respective cascode device can be reduced, but this comes with an often-prohibitive cost of worsening the output-to-output isolation.

As detailed later, the teachings of the present disclosure provide an improved NF/isolation tradeoff by creating mutual coupling between inductors (L1, L2). In other words, the disclosed teachings include noise shaping techniques that can be used to manipulate the noise characteristics of the LNA to improve its overall noise performance while maintaining an acceptable output-to-output isolation. This is performed by controlling the degree of mutual coupling between the pair of inductors (L1, L2) implemented as part of the LNA circuitry. Stated differently, the control of the mutual coupling coefficient between L1 and L2, provides additional flexibility when designing for applications with more stringent and often conflicting requirements.

Figure 2A:
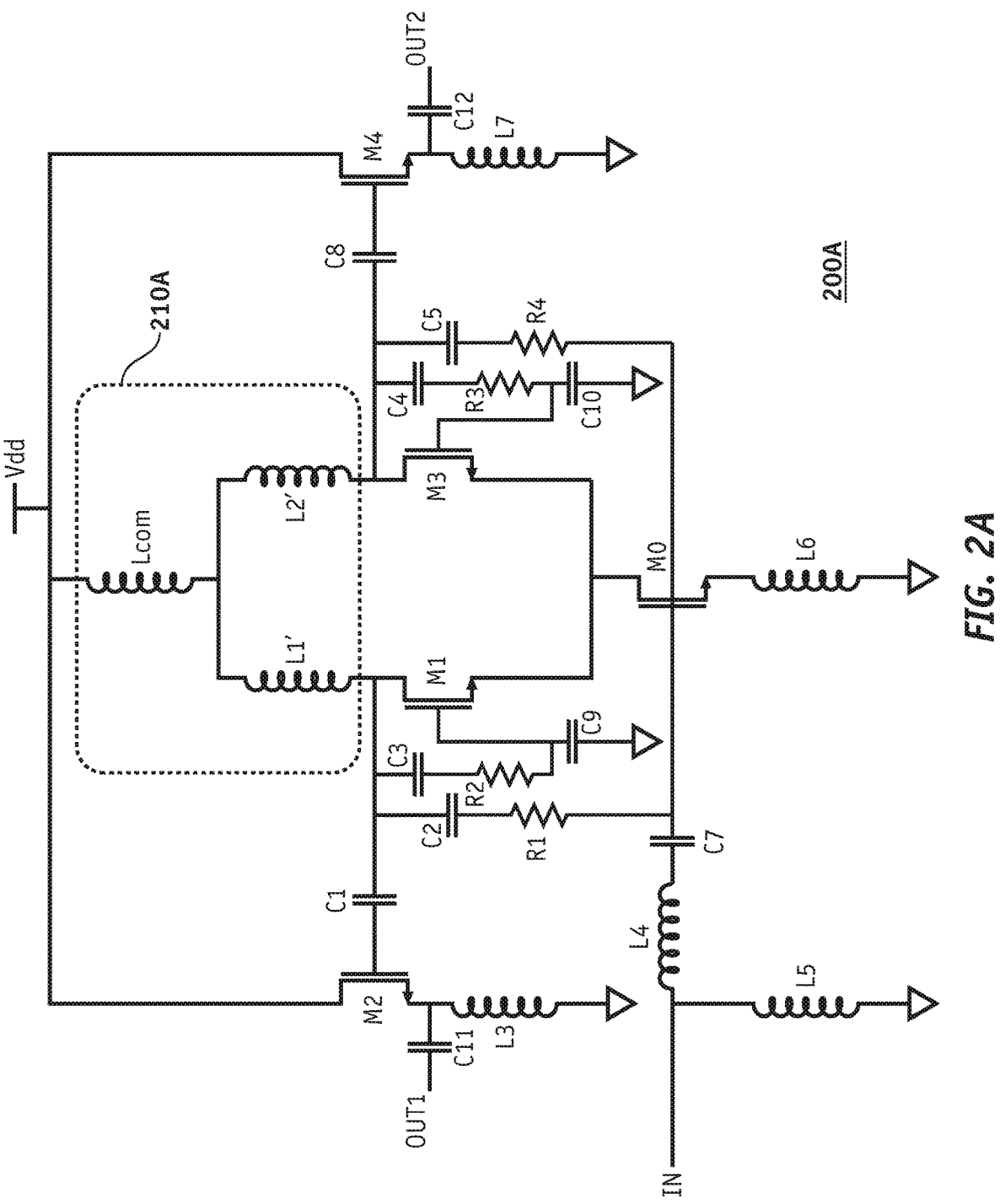
FIGS. 2A-2B show exemplary split LNAs in accordance with an embodiment of the present disclosure.

FIG. 2A shows an exemplary LNA (200A) according to an embodiment of the present disclosure where such mutual coupling is present. The structure and functionality of LNA (200A) is similar to what was described previously with regards to LNA (100) of FIG. 1, except that the pair of inductors (L1, L2) is now replaced by an inductive element (210) that can be schematically represented as including inductors (L1', L2') and common inductor (Lcom). Such inductors (L1', L2', Lcom) are tied together at one end. The other ends of inductors (L1', L2', Lcom) are connected to cascode transistors (M1, M3) and biasing voltage (Vdd), respectively.

Figure 2B:
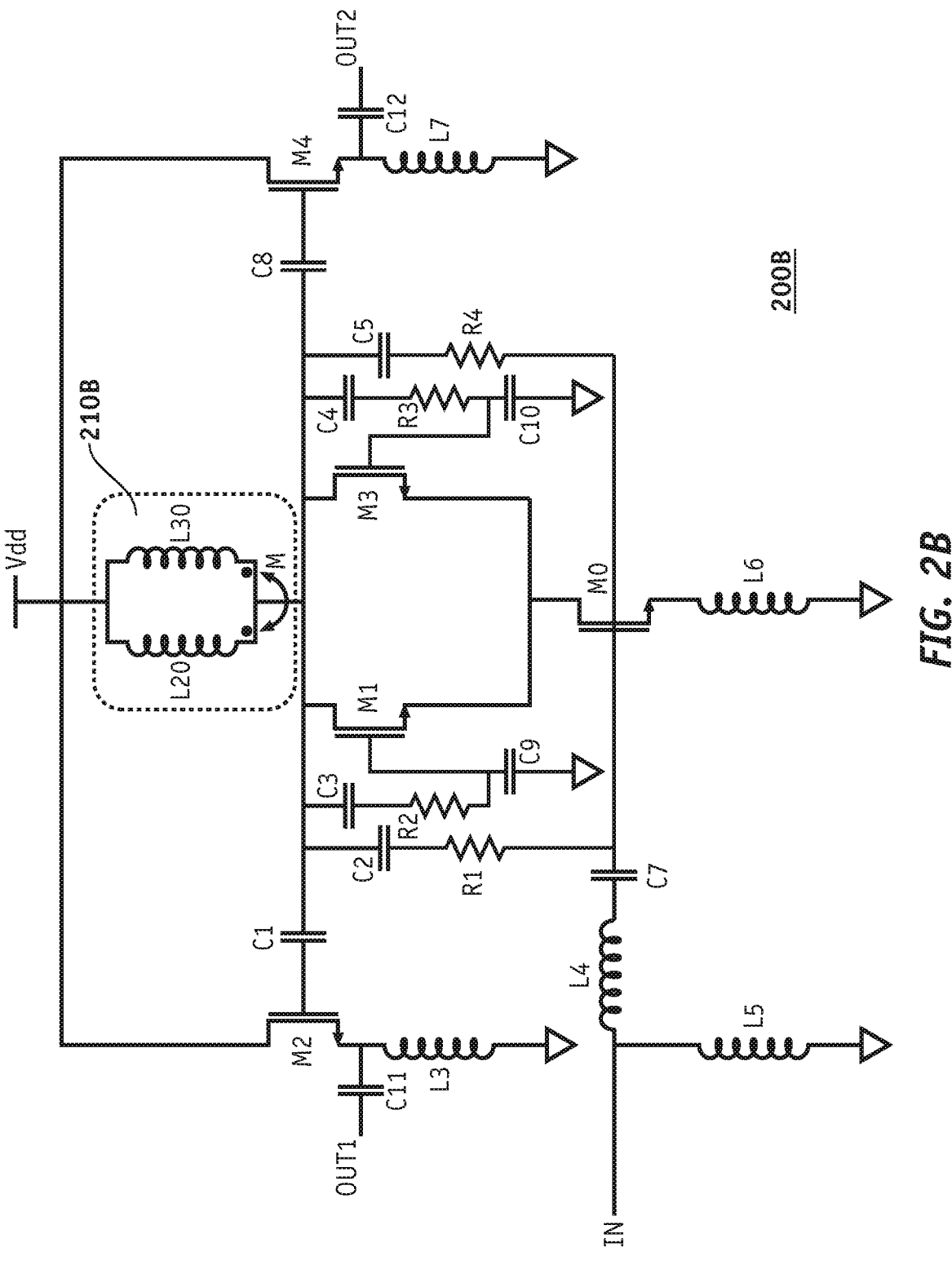

FIG. 2B shows an exemplary LNA (200B) according to an embodiment of the present disclosure. The structure and functionality of LNA (200B) is similar to what was described above with regards to LNA (200A) of FIG. 2A, except that inductive element (210A) is replaced by inductive element (210B) which is schematically represented here as a transformer including inductors (L20. L30) that are mutually coupled, as represented by curved arrow (M) on the figure. Compared to inductive element (210A), the advantage of inductive element (210B) is its compactness achieved by implementing fewer inductors.

With reference to FIGS. 2A-2B, according to the teachings of the present disclosure, the presence of common inductor (Lcom) in FIG. 2A and/or the mutual coupling of inductors (L20, L30) in FIG. 2B, provides further design flexibility to achieve an improved NF/isolation tradeoff. In other words, by controlling/adjusting the inductance values of L1' or L2' of FIG. 2A, or the mutual coupling of inductors (L20, L30) of FIG. 2B, different NF values and isolation depending on the application and its associated requirements can be achieved.

Figure 3:
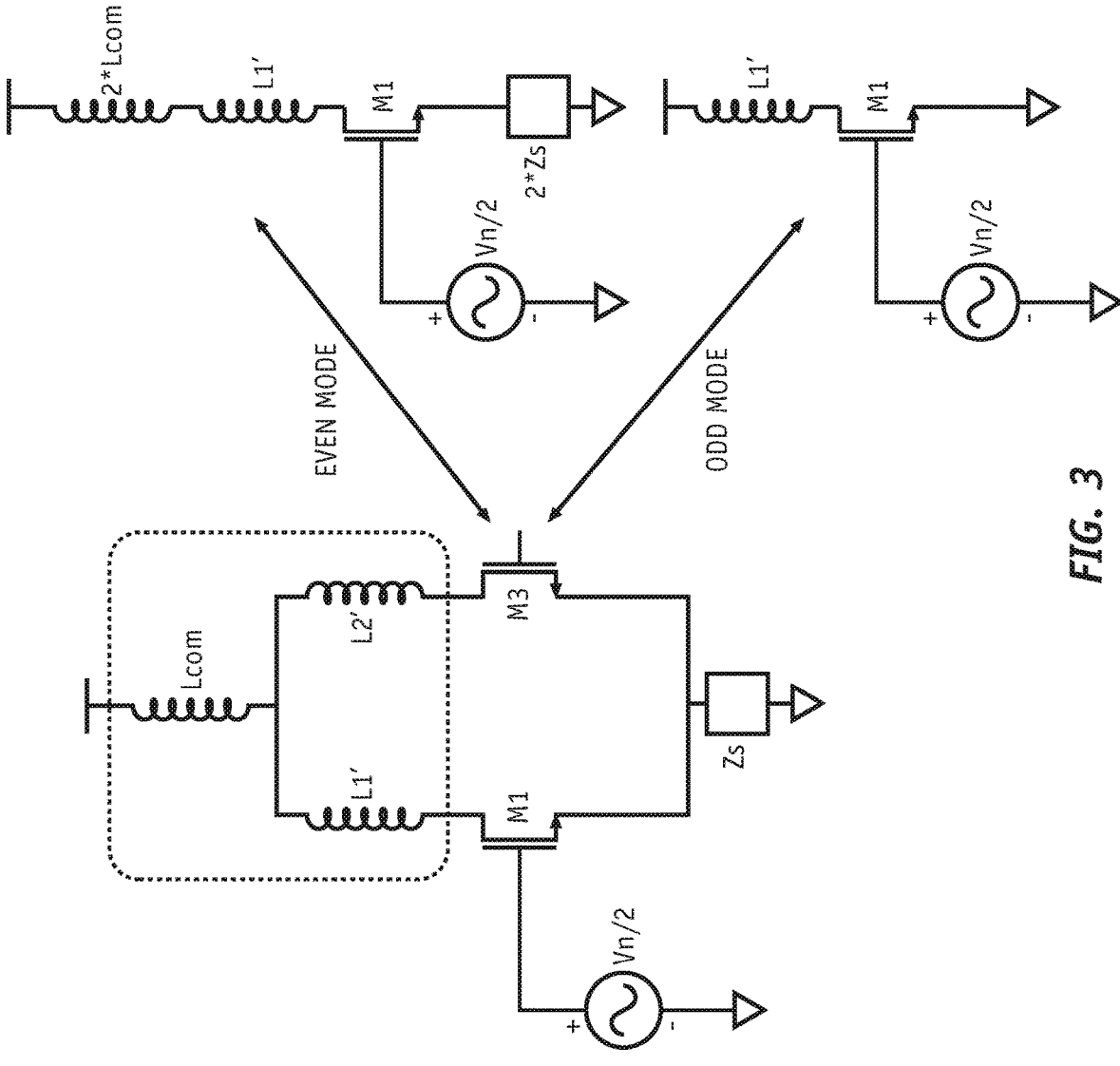
FIG. 3 illustrates the NF/isolation tradeoff in accordance with the teachings of the present disclosure.

Considering the embodiment of FIG. 2A, FIG. 3 represents a brief circuit analysis to clarify how the above-mentioned improved tradeoff can be achieved in accordance with the embodiments of the present disclosure. As shown, the total noise of, for example, the cascode transistor (M1), is the superposition of contributions from the even mode and the odd mode. In a first boundary case, where $L1'=L2'=0$, the drain terminals of transistors (M1, M3) are shorted and the total resulting inductance can be calculated as $Ltot=2*Lcom$. In terms of the performance, the NF has its best value for the design while the output-to-out isolation is the worst for this case. On the other hand, in a second boundary case, where $Lcom=0$, and $L1'=L2'=Ltot$, the NF has its worst value, and the output-to-output isolation is the best for this case. Different tradeoffs between the two boundary cases can therefore be achieved through different $L1'/2'$ and Lcom values. Depending on the requirements, the desired matching may be met by keeping $L1'+2Lcom=Ltot$. Based on a similar analysis conducted on the embodiment of FIG. 2B it can be demonstrated that effective control of the mutual coupling between inductors (L20, L30) enables an enhanced NF/isolation tradeoff. A greater degree of mutual coupling leads to improved NF, albeit at the cost of diminished isolation, and vice versa. Consequently, the coupling between the two inductors offers an additional parameter to enable a more flexible design, tailored to specific application requirements.

Figure 4:
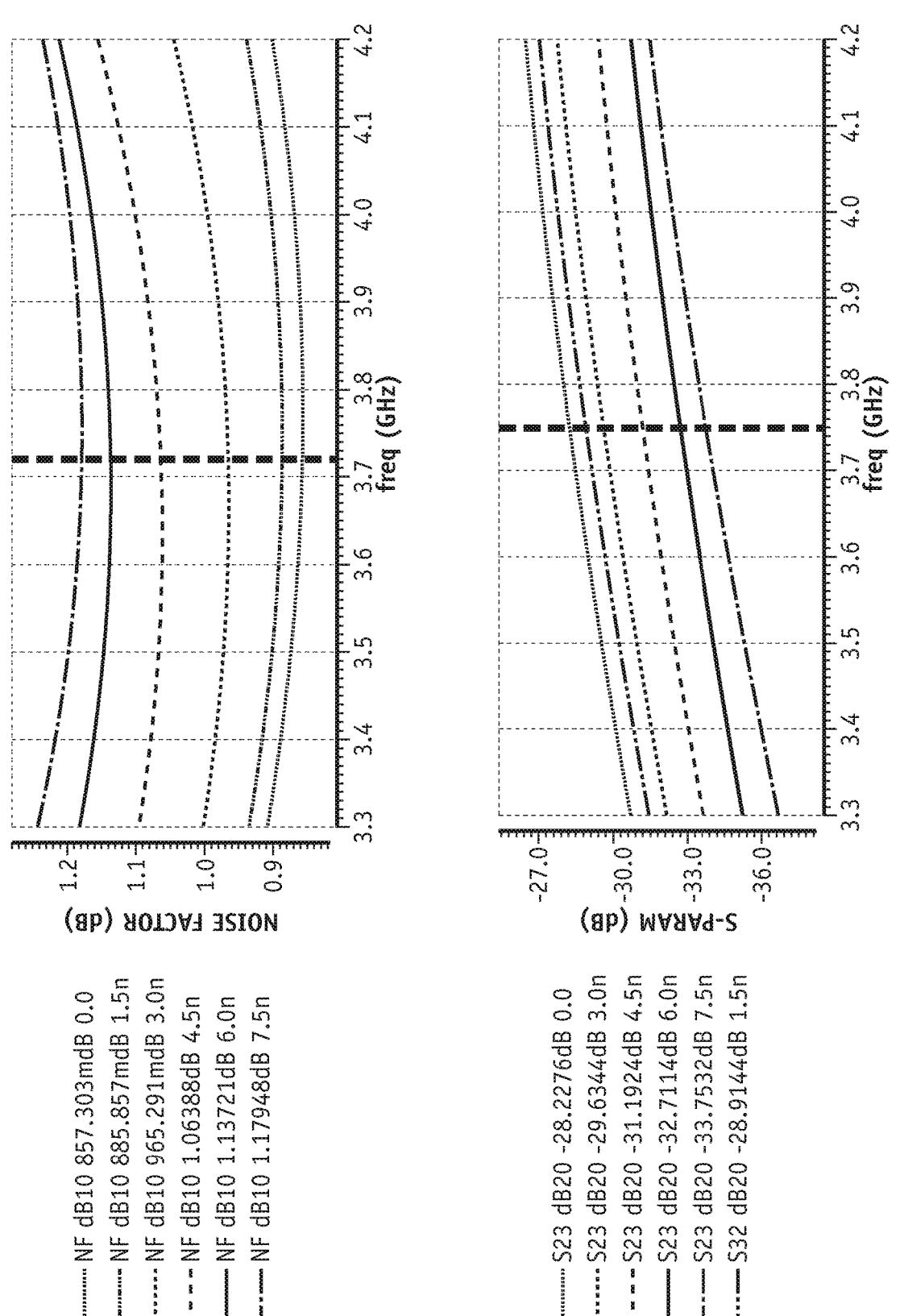
FIGS. 4-5 show graphs illustrating the performance of the disclosed methods and devices.

FIG. 4 shows exemplary graphs further illustrating the performance of the above-disclosed method to control the NF/isolation tradeoff. The upper graph displays a series of curves depicting the variation of the NF vs frequency. The lowest curve in the upper graph indicates the optimal NF value for the first extreme case mentioned earlier. Moving from the bottom to the top, (i.e. increasing (L1,L2) which results in a decrease in Lcom in the embodiment of FIG. 2A or decreasing the mutual coupling (M) in the embodiment of FIG. 2B) of the upper graph results in a deterioration of the NF performance. Conversely, the lower graph presents a series of curves showing the variation of the output-to-output isolation with respect to frequency. The lowest curve in this lower graph depicts the previously mentioned second extreme case, where the isolation is at its best, but the NF is at its worst for the design. Proceeding from the bottom to the top of the lower graph (i.e. decreasing L1 or L2 thus resulting in an increase in Lcom in the embodiment of FIG. 2A or an increase of the mutual coupling (M) in the embodiment of FIG. 2B), the output-to-output isolation decreases/degrades.

Figure 5:
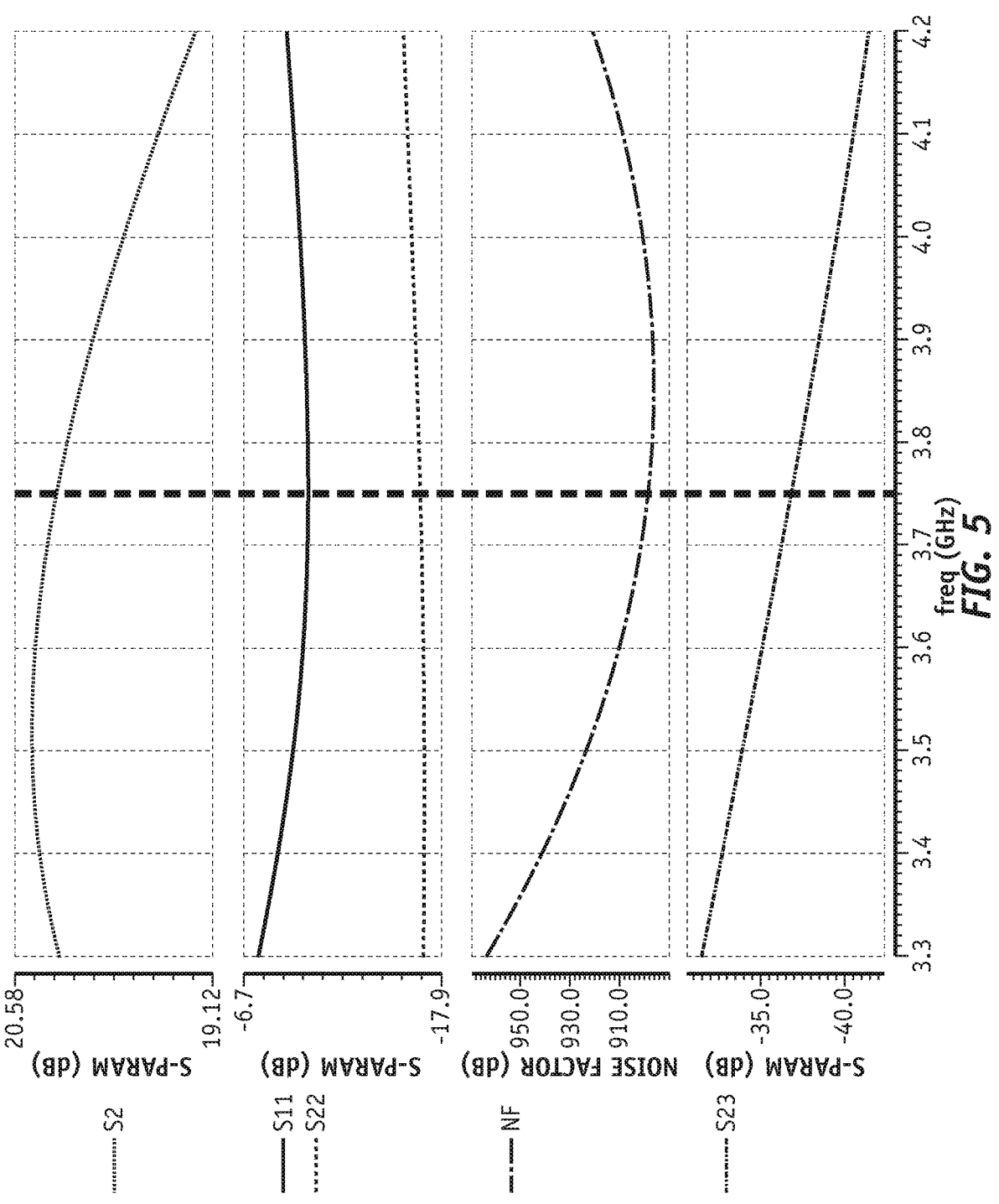

FIG. 5 shows an exemplary graph including a set of curves representing the variations of the S-parameters and the NF vs frequency for certain $L1'/L2'$ values.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A low noise amplifier (LNA) comprising:
an input transistor, a first transistor, and a second transistor;
an inductive element comprising a pair of mutually coupled inductors; a first end of the inductive element and drain-terminals of the first and the second transistors being tied together, and a second end of the inductive element being coupled to a bias voltage;
wherein:
the LNA is configured to receive an input signal from an input terminal, and to generate a first output signal at a first output terminal, and a second amplified signal at a second output terminal, the input terminal being coupled to the input transistor; and
inductance values of each inductor of the pair of mutually coupled inductors and a degree of mutual coupling of the pair of mutually coupled inductors are selectable to control noise figure and output-to-output isolation values while maintaining a set output matching condition.

2. The LNA of claim 1, wherein inductance values of each mutually coupled inductor of the pair of mutually coupled inductors are equal.

3. The LNA of claim 1, wherein the inductive element is a transformer.

4. The LNA of claim 1, wherein each of the first and the second transistor are arranged in a cascode configuration with the input transistor.

5. The LNA of claim 4, wherein the input transistor, the first transistor and the second transistor are FET transistors.

6. The LNA of claim 1, further comprising a third transistor and a fourth transistor, the third transistor coupling the first output terminal to a drain terminal of the first transistor, and the fourth transistor coupling the second output terminal to a drain terminal of the second transistor.

7. The LNA of claim 6, wherein a combination of the input transistor, the first transistor, and the third transistor forms a first amplification path of the LNA, and a combination of the input transistor, the second transistor, and the fourth transistor forms a second amplification path of the LNA.

8. The LNA of claim 7, wherein the first amplification path and the second amplification path provide equal degree of amplification.

9. The LNA of claim 6, wherein the third transistor and the fourth transistor are arranged in a common-source configuration.

10. The LNA of claim 6, comprising an input matching network, the input matching network including:

a degenerative inductance coupling a source-terminal of the input transistor to ground, and a series arrangement of an input inductor and an input capacitor coupling the input terminal to the input transistor.

11. A low noise amplifier (LNA) comprising:

an input transistor, a first transistor, and a second transistor;

an inductive element comprising:

a first inductor coupled to a drain terminal of the second transistor;

a second inductor coupled to a drain terminal of the third transistor, and a common inductor tied at a common node together with the first and second inductor, wherein:

the LNA is configured to receive an input signal from an input terminal, and to generate a first output signal at a first output terminal, and a second amplified signal at a second output terminal, the input terminal being coupled to the input transistor; and inductance values of the first and the second inductor and the choke inductor are selected to meet desired noise figure and output-to-output isolation values while maintaining a set matching condition.

12. The LNA of claim 11, wherein inductance values of the first inductor and the second inductor are equal.

13. The LNA of claim 11, wherein each of the first and the second transistor are arranged in a cascode configuration with the input transistor.

14. The LNA of claim 13, wherein the input transistor, the first transistor and the second transistor are FET transistors.

15. The LNA of claim 11, further comprising a third transistor, and a fourth transistor, the third transistor coupling the first output terminal to a drain terminal of the first transistor, and the fourth transistor coupling the second output terminal to a drain terminal of the second transistor.

16. The LNA of claim 15, wherein a combination of the input transistor, the first transistor, and the third transistor forms a first amplification path of the LNA, and a combination of the input transistor, the second transistor, and the fourth transistor forms a second amplification path of the LNA.

17. The LNA of claim 16, wherein the first amplification path and the second amplification path provide equal degree of amplification.

18. The LNA of claim 16, wherein the third transistor and the fourth transistor are arranged in a common-source configuration.

19. The LNA of claim 16, comprising an input matching network, the input matching network including:

a degenerative inductance coupling a source-terminal of the input transistor to ground, and a series arrangement of an input inductor and an input capacitor coupling the input terminal to the input transistor.

20. A method of adjusting a noise figure and output-to-output isolation in a low noise split amplifier (LNA), the split LNA comprising:

an input transistor, a first transistor, and a second transistor, wherein the input transistor and the first transistor form a first amplification path, and the input transistor and the second transistor form a second amplification path distinct from the first amplification path; and an inductive element comprising a pair of mutually coupled inductors; a first end of the inductive element and drain-terminals of the first and the second transistors being tied together, the method comprising controlling a coupling factor of the pair of mutually coupled inductors; and adjusting the noise figure and the output-to-output isolation of the LNA while maintaining a set output matching.

* * * * *